(12) United States Patent
Wang et al.

(10) Patent No.: US 10,109,474 B1
(45) Date of Patent: Oct. 23, 2018

(54) METHOD FOR FABRICATING HANDLING WAFER

(71) Applicant: United Microelectronics Corp., Hsinchu (TW)

(72) Inventors: Wei-Jin Wang, Singapore (SG); Zhi-Biao Zhou, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/603,046

(22) Filed: May 23, 2017

(51) Int. Cl.
*H01L 21/00* (2006.01)
*H01L 21/02* (2006.01)
*H01L 21/3205* (2006.01)
*H01L 21/321* (2006.01)
*H01L 21/60* (2006.01)

(52) U.S. Cl.
CPC .. *H01L 21/02008* (2013.01); *H01L 21/02016* (2013.01); *H01L 21/02019* (2013.01); *H01L 21/02052* (2013.01); *H01L 21/02123* (2013.01); *H01L 21/321* (2013.01); *H01L 21/3205* (2013.01); *H01L 2021/60075* (2013.01)

(58) Field of Classification Search
None
See application file for complete search history.

(56) References Cited

U.S. PATENT DOCUMENTS

| | | | |
|---|---|---|---|
| 6,232,623 B1 * | 5/2001 | Morita | H01L 21/0242 257/103 |
| 6,673,635 B1 * | 1/2004 | Hellig | H01L 23/544 257/E21.219 |
| 7,781,343 B2 | 8/2010 | Letz et al. | |
| 8,394,280 B1 * | 3/2013 | Wan | G11B 5/1278 216/22 |
| 2006/0223271 A1 * | 10/2006 | Hara | G03F 9/7076 438/294 |
| 2009/0070946 A1 * | 3/2009 | Tamada | B08B 3/02 15/21.1 |
| 2014/0346622 A1 | 11/2014 | Stuber | |

* cited by examiner

*Primary Examiner* — Reema Patel
(74) *Attorney, Agent, or Firm* — J.C. Patents

(57) ABSTRACT

A method for fabricating handling wafer includes providing a substrate, having a front side and a back side. The front side of the substrate is disposed on a supporting pin. A first oxide layer is formed surrounding the substrate. A portion of the first oxide layer is removed to expose the front side of the substrate. An alignment mark is formed on the front side of the substrate.

11 Claims, 6 Drawing Sheets

METHOD FOR FABRICATING HANDLING WAFER

BACKGROUND

1. Field of the Invention

The present invention generally relates to semiconductor fabrication, and particularly to a method for fabricating handling wafer.

2. Description of Related Art

As usually known, an integrated circuit as a semiconductor device is fabricated by semiconductor fabrication processes. The integrated circuit get more complicate if the integrated circuit is more powerful, in which a large number of circuit elements with proper interconnect structure are integrated.

To fabricate the semiconductor device of the integrated circuit, the semiconductor device can be divided into two parts. A first part of the semiconductor device is fabricated beforehand separately. After then, the first part of semiconductor device is attached to a handling wafer, which serves as the actual substrate of the semiconductor device. The second part of the semiconductor device can then be fabricated on the first part over the handling wafer, according to the subsequent fabrication processes.

In the above two-stage fabrication manner, the handling wafer needs to be processed to form the protection structure on the back side and an alignment mark on the front side of the handling wafer. The front side would adapt the semiconductor device.

As can be observed, if the handling wafer is not protected well at the back side, the handling wafer would be damaged, particular to the supporting pin region. This would cause malfunction of the circuit elements at this damage area. The back side of the handling wafer need to be carefully protected to maintain the circuit function.

SUMMARY OF THE INVENTION

The invention provides a method for fabricating handling wafer, of which the back side of the handling wafer can be protected in better condition.

In an embodiment, the invention provides a method for fabricating handling wafer including providing a substrate, having a front side and a back side. The front side of the substrate is disposed on a supporting pin. A first oxide layer is formed surrounding the substrate. A portion of the first oxide layer is removed to expose the front side of the substrate. An alignment mark is formed on the front side of the substrate.

In an embodiment, as to the method for fabricating handling wafer, in the step of disposing the front side of the substrate on the supporting pin, the substrate is flipped up-side-down at a first time.

In an embodiment, as to the method for fabricating handling wafer, the method further comprises forming a nitride layer on the first oxide layer at the back side of the substrate.

In an embodiment, as to the method for fabricating handling wafer, in the step of removing the portion of the first oxide layer, the substrate is flipped up-side-down at a second time with respect to the first time.

In an embodiment, as to the method for fabricating handling wafer, the step of removing the portion of the first oxide layer comprises a wet cleaning process.

In an embodiment, as to the method for fabricating handling wafer, the first oxide layer is formed by a thermal oxidation process.

In an embodiment, as to the method for fabricating handling wafer, the substrate is a silicon on insulator (SOI) substrate.

In an embodiment, as to the method for fabricating handling wafer, after performing the cleaning process to forming the alignment mark, the method further comprises: performing an implantation process on the front side of the substrate, forming a photoresist layer with an alignment opening to expose the substrate at the front side, and etching the substrate at the front side through the alignment opening, to form the alignment mark.

In an embodiment, as to the method for fabricating handling wafer, the method further comprises forming a second oxide layer at least on the front side of the substrate before performing the implantation process, and removing the second oxide layer at the front side of the substrate after performing the implantation process.

In an embodiment, as to the method for fabricating handling wafer, the second oxide layer is surrounding over the front side and the back side of the substrate.

In an embodiment, as to the method for fabricating handling wafer, the method further comprises forming a nitride layer on the first oxide layer at the back side of the substrate.

In an embodiment, as to the method for fabricating handling wafer, after performing the cleaning process to forming the alignment mark, the method further comprises performing an implantation process on the front side of the substrate, forming a photoresist layer with an alignment opening to expose the substrate at the front side, and etching the substrate at the front side through the alignment opening, to form the alignment mark.

In an embodiment, as to the method for fabricating handling wafer, the method further comprises forming a second oxide layer on the front side of the substrate before performing the implantation process, and removing the second oxide layer at the front side of the substrate after performing the implantation process.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to a method for fabricating a handling wafer, involved in a semiconductor device.

Several embodiments are provided to describe the invention with the motivation, but not for limiting the invention.

Figure 1:
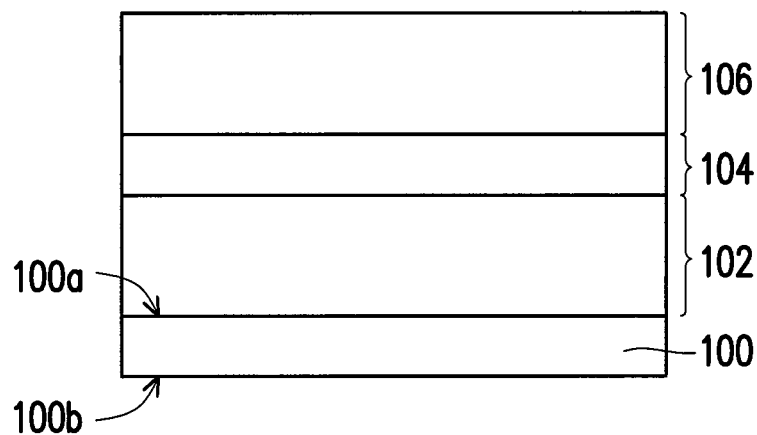
FIG. 1 is a drawing, schematically illustrating a stacked structure of a semiconductor device, according to the invention.

FIG. 1 is a drawing, schematically illustrating a stacked structure of a semiconductor device, according to the invention. Referring to FIG. 1, generally, the handling wafer 100 has a front side 100a and a back side 100b. The semiconductor device including the first routing structure layer 102, a device layer 104 and a second routing structure layer 106 are sequentially disposed on the front side 100a of the handling wafer 100.

However, the first routing structure layer 102 is separately pre-fabricated on another temporary substrate but not directly fabricated on the handling wafer 100. As to be described later, after the first routing structure layer 102 is formed, the first routing structure layer 102 would be disposed onto the handling wafer 100 with proper alignment. The handling wafer in an example is a silicon-on-insulator (SOI) substrate.

Figure 2:
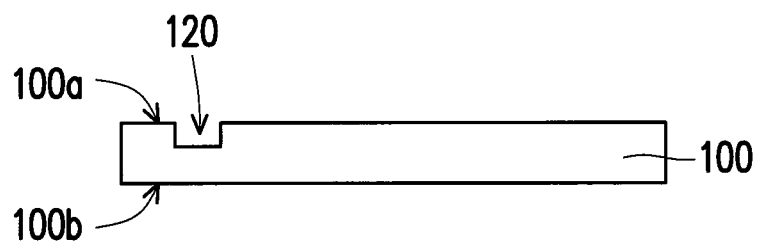
FIG. 2 is a drawing, schematically illustrating a structure of handling wafer, according to an embodiment of the invention.

FIG. 2 is a drawing, schematically illustrating a structure of handling wafer, according to an embodiment of the invention. Referring to FIG. 2, in order to adapt the first routing structure layer 102, with proper alignment, an alignment mark 120 needs to be formed on the handling wafer 100 before stacking the first routing structure layer 102. In other words, the handling wafer 100 needs to be firstly processed to form the protection layer at the back side 100b and an alignment mark on the front side 100a to adapt the first routing structure layer 102 with alignment.

Figure 3:
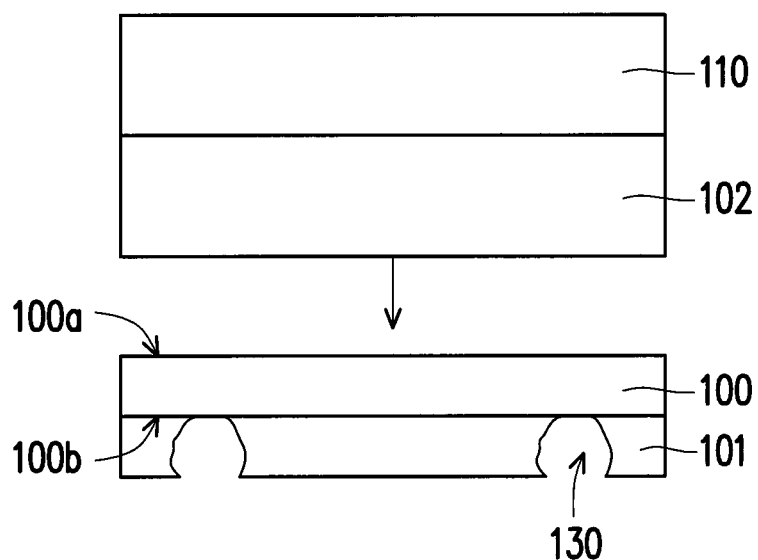
FIG. 3 is a drawing, schematically illustrating an assembly process for the handling wafer to adapt the semiconductor device, according to an embodiment of the invention.

FIG. 3 is a drawing, schematically illustrating an assembly process for the handling wafer to adapt the semiconductor device, according to an embodiment of the invention. Referring to FIG. 3, as stated above, the first routing structure layer 102, having an interconnect structure having be formed inside, is fabricated on the temporary substrate 110. And then, the first routing structure layer 102 with the temporary substrate 110 is attached to the handling wafer 100 at the front side 100a. As to the handling wafer 100, an oxide layer 101 has been formed on the backs side 100b of the handling wafer 100 for protection. However, a defect 130 usually exists in the oxide layer 101 when formation to be described in detail later. The defect 130 may almost or actually expose the handling wafer 100 corresponding to the locations of supporting pins.

Figure 4:
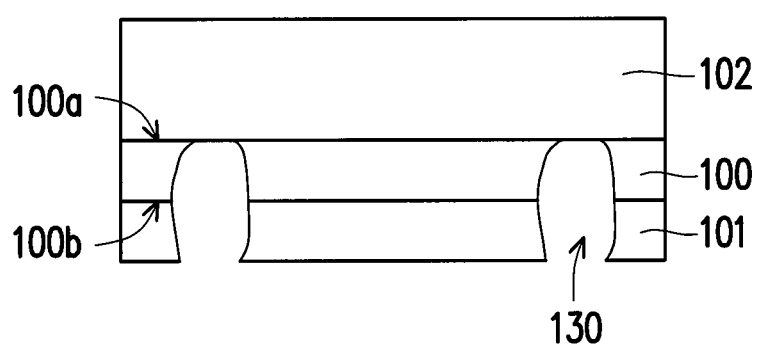
FIG. 4 is a drawing, schematically illustrating a preliminary semiconductor device adapted by the handling wafer, according to an embodiment of the invention.

FIG. 4 is a drawing, schematically illustrating a preliminary semiconductor device adapted by the handling wafer, according to an embodiment of the invention. Referring to FIG. 4, after the first routing structure layer 102 is firmly stacked on the handling wafer 100 at the front side 100a, the temporary substrate 110 is removed.

Typically, the temporary substrate 110 and the handling wafer 100 are both made of silicon. During removing the temporary substrate 110 by wet etchant such as TMAH (tetra-methyl ammonium hydroxide) solution, if the back side 100b of the handling wafer 100 is not well protected by the oxide layer, the defect 130 as currently existing in the oxide layer 101 may even further punch through the handling wafer 100 and reach to the first routing structure layer 102. After then, the device layer 104 and the second routing structure layer 106 as shown in FIG. 1 may be subsequently disposed on.

Figure 5:
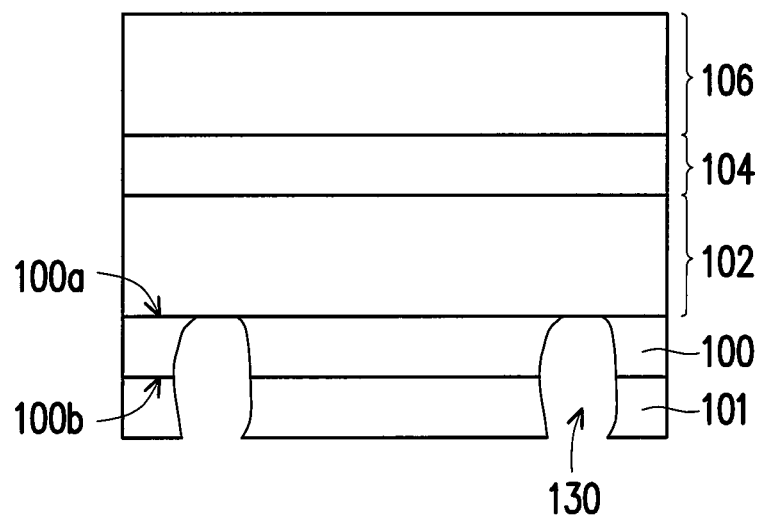
FIG. 5 is a drawing, schematically illustrating a defect occurring on the handling wafer of the semiconductor device, according to an embodiment of the invention.

The invention has looked into the semiconductor device in FIG. 1 and found at least an issue, which may cause the malfunction of the semiconductor device. FIG. 5 is a drawing, schematically illustrating a defect occurring on the handling wafer of the semiconductor device, according to an embodiment of the invention. Referring to FIG. 5, in fabrication process on the handling wafer 100, the handling wafer usually needs to be processed to form the alignment mark and the implantation on the front side 100a and the protection layer at the back side 100b of the handling wafer 100. Due to the supporting pins at the back side 100b as taken in usual way to hold the handling wafer 100, the supporting pins may cause the defects 130 from the back side 100b of the handling wafer 100. In the even worse case, the defect 130 may punch through the handling wafer 100 and reach to the first routing structure layer 102.

Due to the defect 130 possibly exposing the first routing structure layer 102, the first routing structure layer 102 may be damaged in the subsequent process. As a result, it causes malfunction of the whole semiconductor device.

Figure 6:
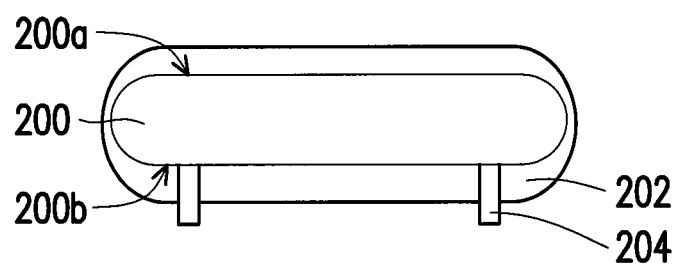
FIG. 6 is a drawing, schematically illustrating the mechanism causing the defect of the handling wafer, according to an embodiment of the invention.
Figure 7:
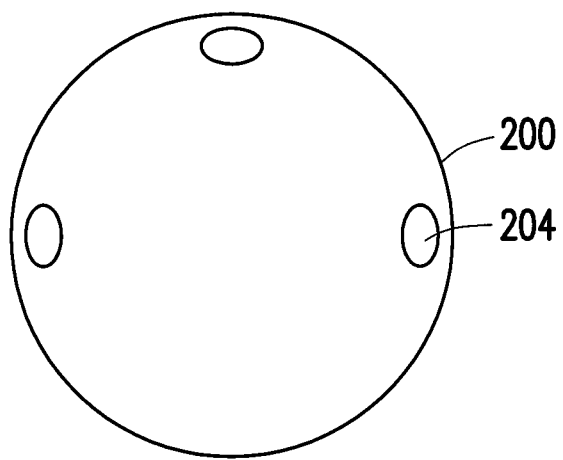
FIG. 7 is a drawing, schematically illustrating the supporting pin to support the handling wafer, according to an embodiment of the invention.

The invention has looked into the issue in better detail as follows. FIG. 6 is a drawing, schematically illustrating the mechanism causing the defect of the handling wafer, according to an embodiment of the invention. FIG. 7 is a drawing, schematically illustrating the supporting pin to support the handling wafer, according to an embodiment of the invention.

Referring to FIG. 6 and FIG. 7, as the usual way, the handling wafer 200 in beginning stage of processing is supported by supporting pins 204 at the back side 200b so to perform a thermal oxidation and then thereby form the oxide layer 202 surrounding the handling wafer 200. This thermal oxidation process is performed in a furnace. Wafers are placed in a wafer boat including wafer slots for accommodating wafers, and supporting pins are provided in each wafer slots to ensure wafers are placed in a proper position. As noted, the supporting pins 204 support the handling wafer 200 at the back side 200b with directly contact to the handling wafer 200. As a result, the thermal oxidation has poor effect at the contact surface between the supporting pins 204 and the handling wafer 200 and also the space occupied by the supporting pins 204 themselves. In other words, the oxide layer 202 cannot fully cover over the handling wafer 200 at the back side 200b. This issue would cause the defect on the handling wafer 200 in the subsequent fabrication process to accomplish the semiconductor device.

Figure 8:
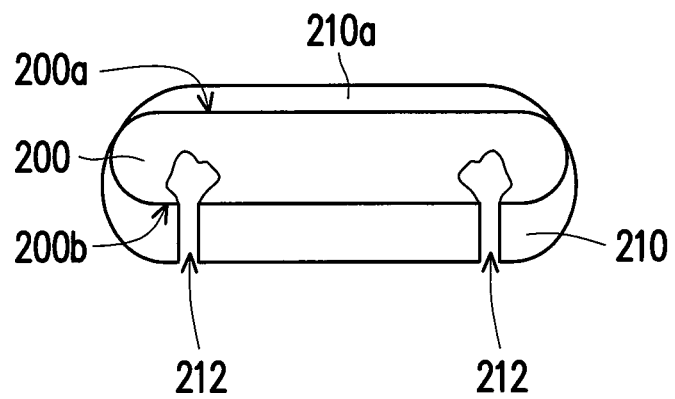
FIG. 8 is a drawing, schematically illustrating the defect of the handling wafer, according to an embodiment of the invention.

FIG. 8 is a drawing, schematically illustrating the defect of the handling wafer, according to an embodiment of the invention. Referring to FIG. 8, in the subsequent fabrication processes, after the handling wafer 200 is taken out from the supporting pins 204. In the subsequent fabrication processes, the additional thermal oxidation may be performed to form the protection layer 210 at the back side 200 of the handing wafer or a screen oxide layer 210a on the front side 200a for implantation. The defects 212 corresponding to the pin areas may remain at the back side 200b of the handling wafer 200, causing the malfunction of the semiconductor device.

The invention has at least looked into the issues stated above, and then proposes to flip the handling wafer 200 when the thermal oxidation process is performed on the handling wafer at the beginning stage. After then, the handling wafer 200 is flipped back for wet cleaning process on the front side of the handling wafer.

Figure 9:
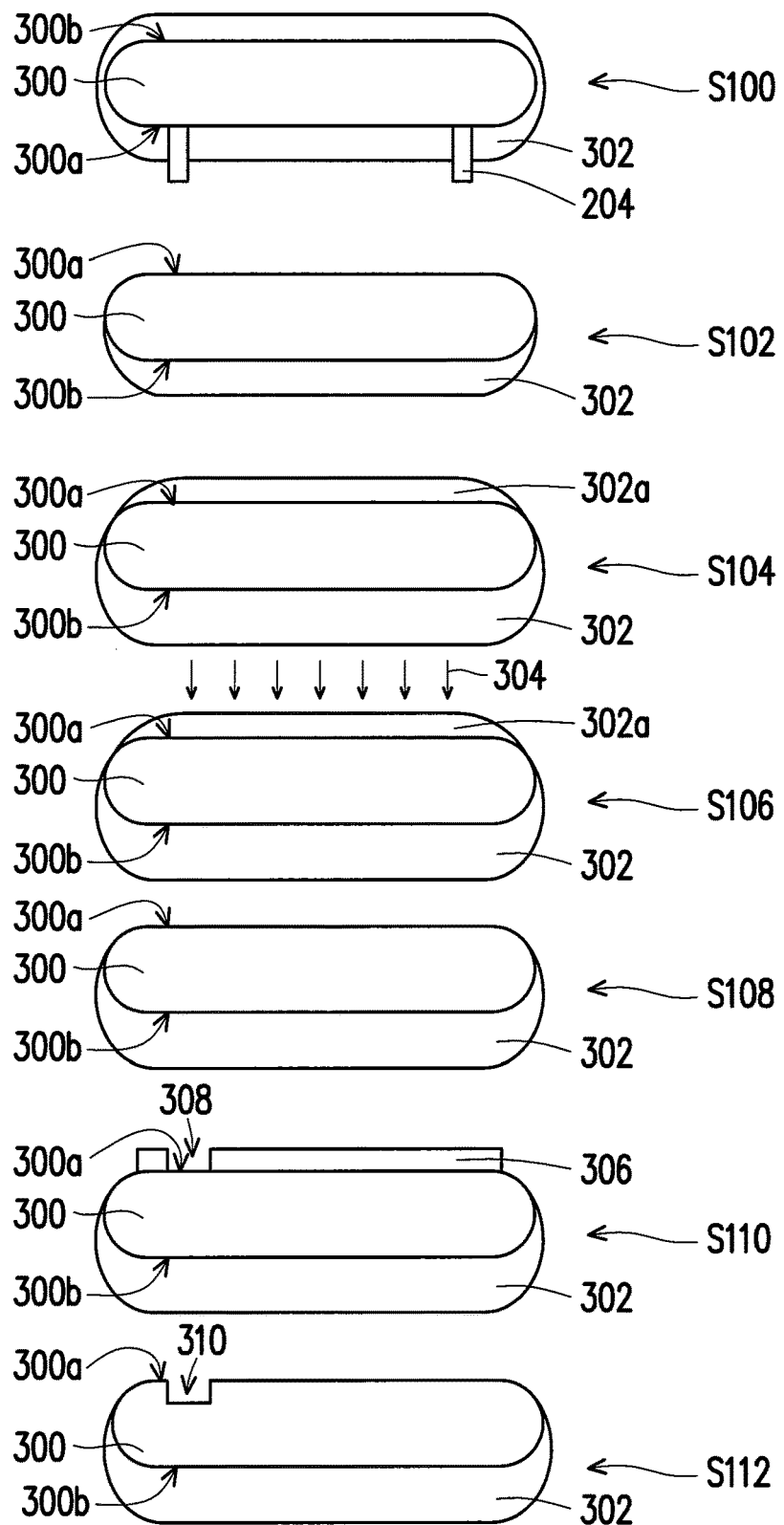
FIG. 9 is a drawing, schematically illustrating the method for fabricating the handling wafer, according to an embodiment of the invention.

FIG. 9 is a drawing, schematically illustrating the method for fabricating the handling wafer, according to an embodiment of the invention. Referring to FIG. 9, in step S100, a substrate 300 is provided. The substrate 300 has a front side 300a and a back side 300b. However, the substrate 300 is flipped, so that the front side 300a is disposed on the supporting pins 204. At this beginning stage, a thermal oxidation process is performed to form the oxide layer 302 to surround the substrate 300. The thickness of the oxide layer 302 is for example 4000 A or less but not limited to this thickness. However, in general, the oxide layer 302 is fully surround substrate 300.

Remarkably in this stage, the supporting pins 204 contact on the front side 300a. The front side 300a of the substrate 300, serving as the handling wafer, is to adapt the routing structure layer later.

In step S102, the substrate 300 is flipped back, so the front side 300a in this stage as drawn is at the top side. The back side 300b is the bottom side. A portion of the oxide layer 302 on the front side 300a of the substrate 300 is removed, such as wet cleaning, or other proper process, without limiting to the example. The front side 300a of the substrate 300 is then exposed.

Remarkably, the pin effect occurring on the front side 300a of the handling wafer is effectively excluded. However, the back side 300b of the substrate 300 can be well protected by the oxide layer 302 without pin effect.

In step S104, additional oxide layer 302a is formed on the exposed surface of the substrate 300 at the front side 300a. The oxide layer 302a can be formed by another thermal oxidation process, so the oxide layer 302 at the back side 300b get thicker. The oxide layer 302a in function can be also realized as the screen layer, which is in association with implantation process 304 later on the substrate 300 in step S106.

Actually, the oxide layer 302a is optionally formed and therefore can be omitted. However, in the embodiment, the oxide layer 302a is formed as an example. As to the thickness of the oxide layer 302a, it can be in a range between 0 A and 500 A, in which 0 A indicates the oxide layer 302a is omitted. Also, the impurity in the implantation process is Ge, for example. However, the implantation process is also an embodiment, not absolutely required in processing the handling wafer.

In step S108, after the implantation process 304, the oxide layer 302a is removed again to expose the front side 300a of the substrate 300.

In step S110, a photoresist layer 306 with an alignment opening 308, as an example, is formed on the substrate 300 at the front side 300a.

In step S112, the photoresist layer 306 serves as an etching mask and an etching process is performed to form the alignment mark 310 on the substrate. And then, the photoresist layer 306 is removed. The alignment mark 310 is used for alignment when the routing structure layer is attached to the substrate 300 as shown in FIG. 3.

Figure 10:
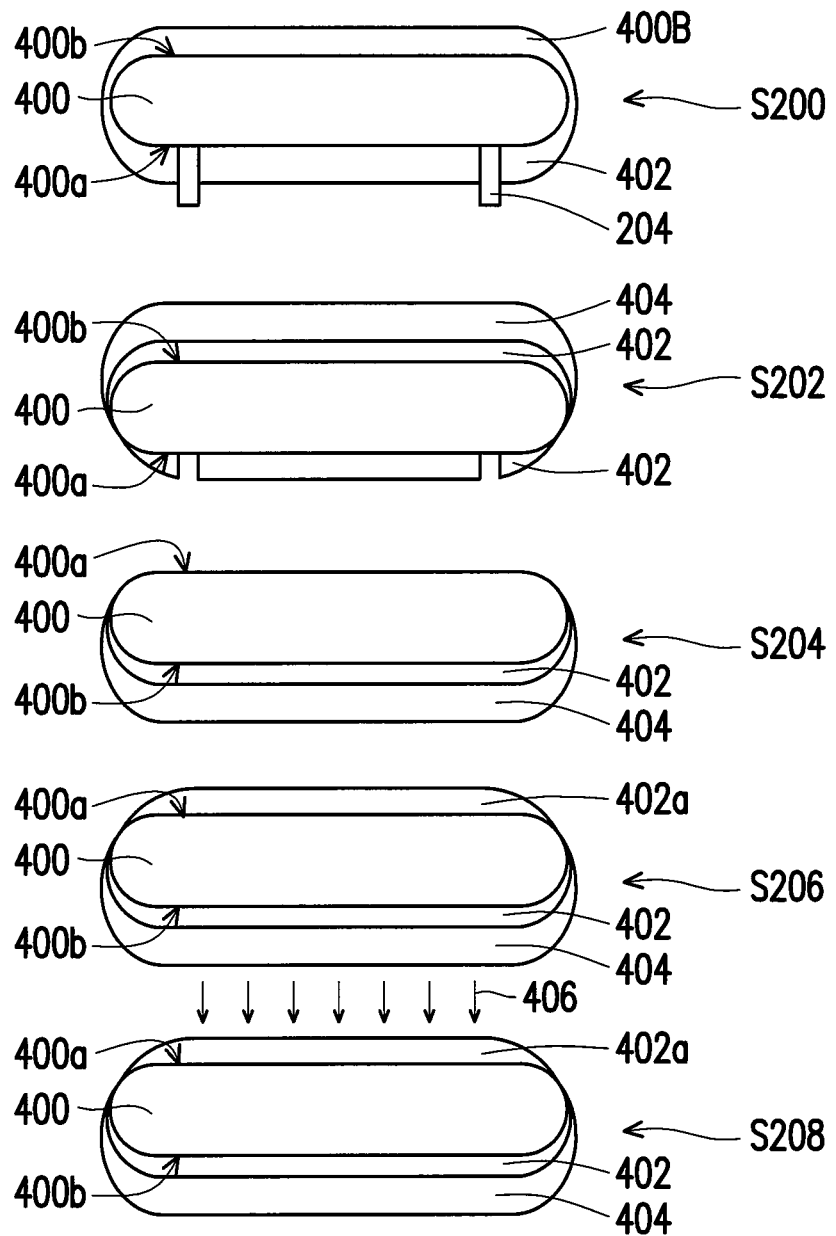
FIG. 10 is a drawing, schematically illustrating the method for fabricating the handling wafer, according to an embodiment of the invention.

Alternatively in another embodiment, FIG. 10 is a drawing, schematically illustrating the method for fabricating the handling wafer, according to an embodiment of the invention. Referring to FIG. 10, in step S200, a substrate 400 is provided, likewise to FIG. 9. The substrate 400 has a front side 400a and a back side 400b. However, the substrate 400 is flipped, so that the front side 400a is disposed on the supporting pins 204. At this beginning stage, a thermal oxidation process is performed to form the oxide layer 402 to surround the substrate 400. The thickness of the oxide layer 302 is for example 4000 A or less but not limited to this thickness. However, in general, the oxide layer 302 is fully surround substrate 300.

In step S202, the substrate 400 keeps at the flipped state, in which a nitride layer 404 can be additionally formed on the oxide layer 402 over the back side 400b. The nitride layer 404 is formed by a single wafer deposition tool, such as a plasma enhanced chemical vapour deposition tool, which only deposits films on one side of the wafer. The nitride layer 404 serves as a part of the protection layer at the back side 400b of the substrate 400.

In step 204, the substrate 400 now is flipped back, so the front side 400a is the top side and the back side 400b is the bottom side. A portion of the oxide layer 402 at the front side 400a of the substrate 400 is removed by a process, such as wet clean, but not limiting to wet clean.

In step S206, the oxide layer 402a is formed to serve as the screen layer similarly to the step S104 in FIG. 9. In step S208, the implantation process 406 with the impurity of Ge is performed. This is similar to the step S106 in FIG. 9.

After then, the alignment mark is to be formed on the substrate 400 at the front side 400a. The processes can be referred to the steps S108, S110 and S112 in FIG. 9 without further descriptions.

As to the foregoing descriptions, the back side of the handling wafer has not suffering the pin effect. The pin effect actually occurs on the front side of the handling wafer. However, the pin effect on the front side of the handling wafer can be removed due to the wet cleaning process at the next stage. As a result, the front side of the handling wafer can keep the quality as usual. The back side of the handling wafer has no pin effect at the beginning stage of thermal oxidation process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating handling wafer, comprising:
providing a substrate, having a front side and a back side;
disposing the front side of the substrate on a supporting pin;
forming a first oxide layer, surrounding the substrate;
removing a portion of the first oxide layer to expose the front side of the substrate; and
forming an alignment mark on the front side of the substrate,
wherein in the step of disposing the front side of the substrate on the supporting pin, the substrate is flipped up-side-down at a first time, and
wherein in the step of removing the portion of the first oxide layer, the substrate is flipped up-side-down at a second time with respect to the first time.

2. The method for fabricating handling wafer as recited in claim 1, wherein the step of removing the portion of the first oxide layer comprises a wet cleaning process.

3. The method for fabricating handling wafer as recited in claim 1, wherein the first oxide layer is formed by a thermal oxidation process.

4. The method for fabricating handling wafer as recited in claim 1, wherein the substrate is a silicon on insulator (SOI) substrate.

5. The method for fabricating handling wafer as recited in claim 1, after removing the portion of the first oxide to forming the alignment mark, further comprising:
performing an implantation process on the front side of the substrate;
forming a photoresist layer with an alignment opening to expose the substrate at the front side; and
etching the substrate at the front side through the alignment opening, to form the alignment mark.

6. The method for fabricating handling wafer as recited in claim 5, further comprising:
forming a second oxide layer at least on the front side of the substrate before performing the implantation process; and
removing the second oxide layer at the front side of the substrate after performing the implantation process.

7. The method for fabricating handling wafer as recited in claim 6, the second oxide layer is surrounding over the front side and the back side of the substrate.

8. The method for fabricating handling wafer as recited in claim 1, further comprising forming a nitride layer on the first oxide layer at the back side of the substrate.

9. The method for fabricating handling wafer as recited in claim 8, after removing the portion of the first oxide to forming the alignment mark, further comprising:
performing an implantation process on the front side of the substrate;
forming a photoresist layer with an alignment opening to expose the substrate at the front side; and
etching the substrate at the front side through the alignment opening, to form the alignment mark.

10. The method for fabricating handling wafer as recited in claim 9, further comprising:
forming a second oxide layer on the front side of the substrate before performing the implantation process; and
removing the second oxide layer at the front side of the substrate after performing the implantation process.

11. A method for fabricating handling wafer, comprising:
providing a substrate, having a front side and a back side;
disposing the front side of the substrate on a supporting pin;
forming a first oxide layer, surrounding the substrate;
forming a nitride layer on the first oxide layer at the back side of the substrate;
removing a portion of the first oxide layer to expose the front side of the substrate; and
forming an alignment mark on the front side of the substrate,
wherein in the step of disposing the front side of the substrate on the supporting pin, the substrate is flipped up-side-down at a first time, and
wherein in the step of removing the portion of the first oxide layer, the substrate is flipped up-side-down at a second time with respect to the first time.

* * * * *